(12) United States Patent
Wong et al.

(10) Patent No.: US 8,299,802 B2
(45) Date of Patent: Oct. 30, 2012

(54) METHOD TO DIGITIZE ANALOG SIGNALS IN A SYSTEM UTILIZING DYNAMIC ANALOG TEST MULTIPLEXER FOR DIAGNOSTICS

(75) Inventors: Wilson Wong, San Francisco, CA (US); Allen Chan, San Jose, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 818 days.

(21) Appl. No.: 12/263,290

(22) Filed: Oct. 31, 2008

(65) Prior Publication Data
US 2010/0109675 A1    May 6, 2010

(51) Int. Cl.
*G01R 31/02* (2006.01)
(52) U.S. Cl. ...................... 324/537; 324/73.1
(58) Field of Classification Search .................. 324/537, 324/712, 76.82, 762.02
See application file for complete search history.

(56) References Cited

U.S. PATENT DOCUMENTS

| 7,188,036 B2 | 3/2007 | Strittmatter |
| 2004/0041595 A1 | 3/2004 | Ogawa et al. |
| 2006/0247873 A1 | 11/2006 | Fung et al. |

FOREIGN PATENT DOCUMENTS

JP    2002-107424 A    4/2002

*Primary Examiner* — Vincent Q Nguyen
(74) *Attorney, Agent, or Firm* — Womble Carlyle Sandridge & Rice, LLP

(57) ABSTRACT

An integrated circuit capable of monitoring analog voltages inside an analog block is presented. The integrated circuit has an analog test multiplexer (mux) whose inputs are connected to analog voltages of interest inside an analog block. The analog test multiplexer directs a selected analog voltage from an analog block to the output of the analog test mux. The integrated circuit further includes an analog monitor state machine which provides the selection bits to the analog test multiplexer, enabling random access to the analog voltages inside the analog block. The integrated circuit also includes an analog to digital converter for converting the selected analog voltage from the analog test multiplexer into a digital representation.

19 Claims, 5 Drawing Sheets

METHOD TO DIGITIZE ANALOG SIGNALS IN A SYSTEM UTILIZING DYNAMIC ANALOG TEST MULTIPLEXER FOR DIAGNOSTICS

BACKGROUND

In mixed mode integrated circuits with large analog blocks, such as high-speed serial interfaces, there is a need to analyze the health of the analog blocks of the integrated circuit while in operation. The joint test action group (JTAG) standard can be used to test a failure along the connectivity path between chips. However, this is limited to the interfacing circuits of the integrated circuit, specifically the input/output circuitry and routing, and does not provide access to voltages inside an analog block. Another drawback of the JTAG standard is the use of a scan chain which can only read out the voltages in a fixed sequence. The scan chain mechanism does not generally help test for timing or other dynamic operational errors that may occur. Additionally, it is desirable to keep the system running in place and being able to debug the system without having to shut it down. Faulty components in a system are often tested one at a time, which requires bringing down the system and debugging each component separately.

It is in this context that embodiments of the invention arise.

SUMMARY

Broadly speaking, the present invention fills these needs by providing a method and apparatus for selectively accessing analog voltages inside an analog block. It should be appreciated that the present invention can be implemented in numerous ways, including as a method, a system, or a device. Several inventive embodiments of the present invention are described below.

In accordance with one aspect of the invention, an integrated circuit capable of monitoring analog voltages inside an analog block, is provided. The integrated circuit has an analog test multiplexer (mux) whose inputs are connected to analog voltages of interest inside an analog block. The analog test multiplexer directs the selected analog voltage from the analog block to the output of the analog test mux. The integrated circuit further includes an analog monitor state machine. The analog state machine provides selection bits to the analog test multiplexer, enabling random or selective access to the analog voltages inside the analog block. The integrated circuit also includes an analog to digital converter for converting the selected analog voltage from the analog test multiplexer into a digital representation.

In accordance with another aspect of the invention, a method of selectively analyzing analog voltages inside an analog block is detailed. The method begins when the analog test multiplexer receives the analog voltages from the analog block. In the next operation, the analog test multiplexer receives a selection signal from an analog monitor state machine. The selection signal from the analog monitor state machine selectively accesses any of the analog voltages connected to the voltage input of the analog test mux. The method also converts the selected accessed analog voltage from the analog test mux into a digital representation.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for selectively accessing analog voltages inside an analog block. It will be obvious, however, to one skilled in the art, that the present invention may be practiced without some or all of these specific details. In other instances, well known process operations have not been described in detail in order not to unnecessarily obscure the present invention.

In one embodiment of the present invention described below, an analog test module with an analog test multiplexer and analog to digital converter enables selective probing into the analog portions of a mixed mode integrated circuit. The analog test module allows monitoring of the analog voltages inside the analog block to identify potential problems. This level of testing can be considered as a layer of diagnostic capability, which can be done in real time without interrupting operation of a system. The embodiments eliminate the need for a specialized tester, thereby enabling point of use testing with the system running. The critical analog voltages are predetermined and the required connections are added to the analog block in the integrated circuit.

Figure 1:
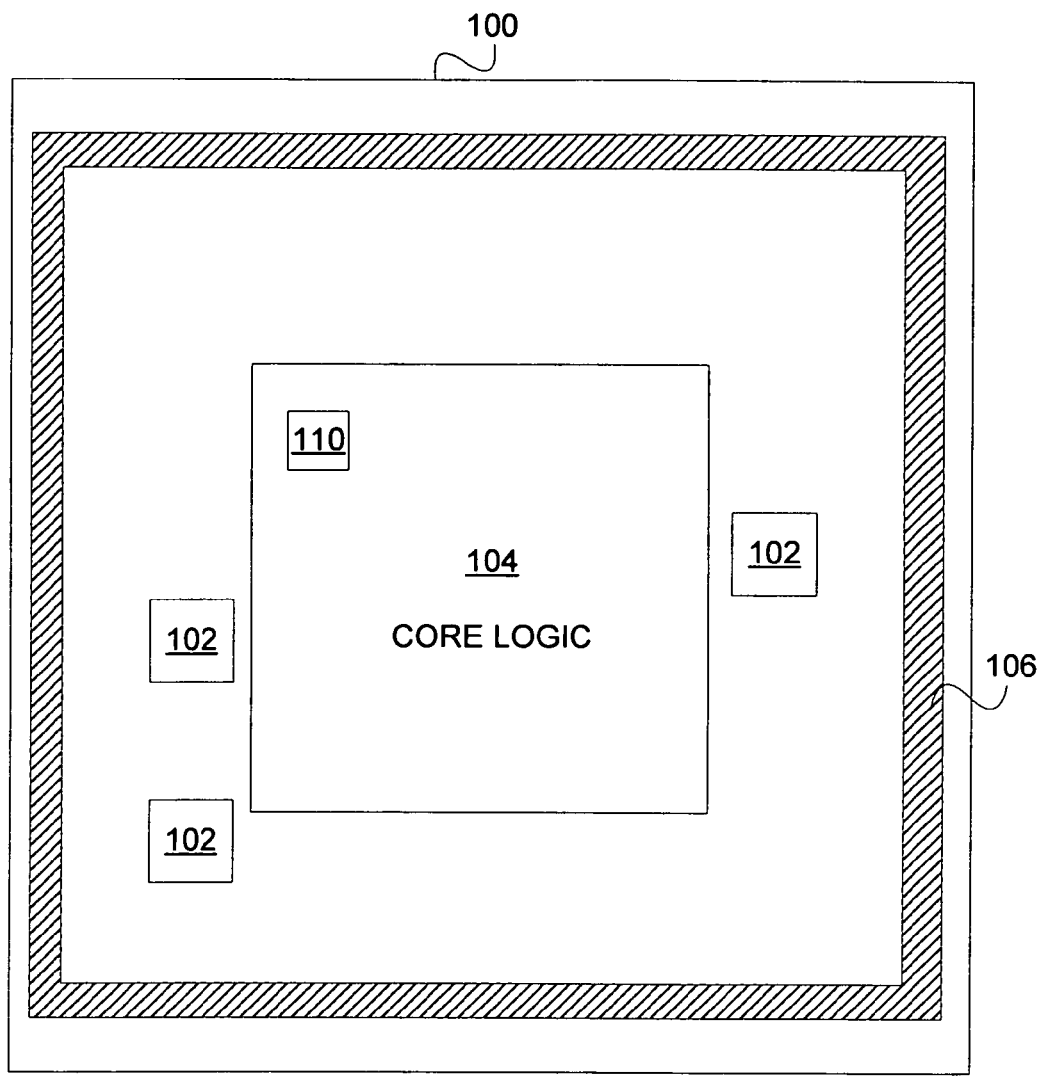
FIG. 1 illustrates a top view of an integrated circuit utilizing an circuitry capable of monitoring analog voltages inside an analog block in accordance with one embodiment of the present invention.

FIG. 1 illustrates a top view of an integrated circuit utilizing circuitry capable of monitoring analog voltages inside an analog block in accordance with one embodiment of the present invention. An integrated circuit 100, such as a processor or an application specific integrated circuit (ASIC), consists of several analog blocks 102, as well as the core logic 104 of the integrated circuit 100. The analog blocks 102 may contain high speed interfaces, transceivers, as well as phase lock loops (PLL). In one embodiment, an analog test module 110 providing access to analog voltages inside the analog blocks 102 is contained in the core logic 104 of the integrated circuit 100. The input/output (I/O) ring 106 contains circuits which transmit and receive signals between the core logic 104 and the analog blocks 102, and the rest of the system. One skilled in the art will appreciate that any known I/O standards may be supported by the I/O circuitry, such as LVDS, TTL, etc. standards.

Figure 2:
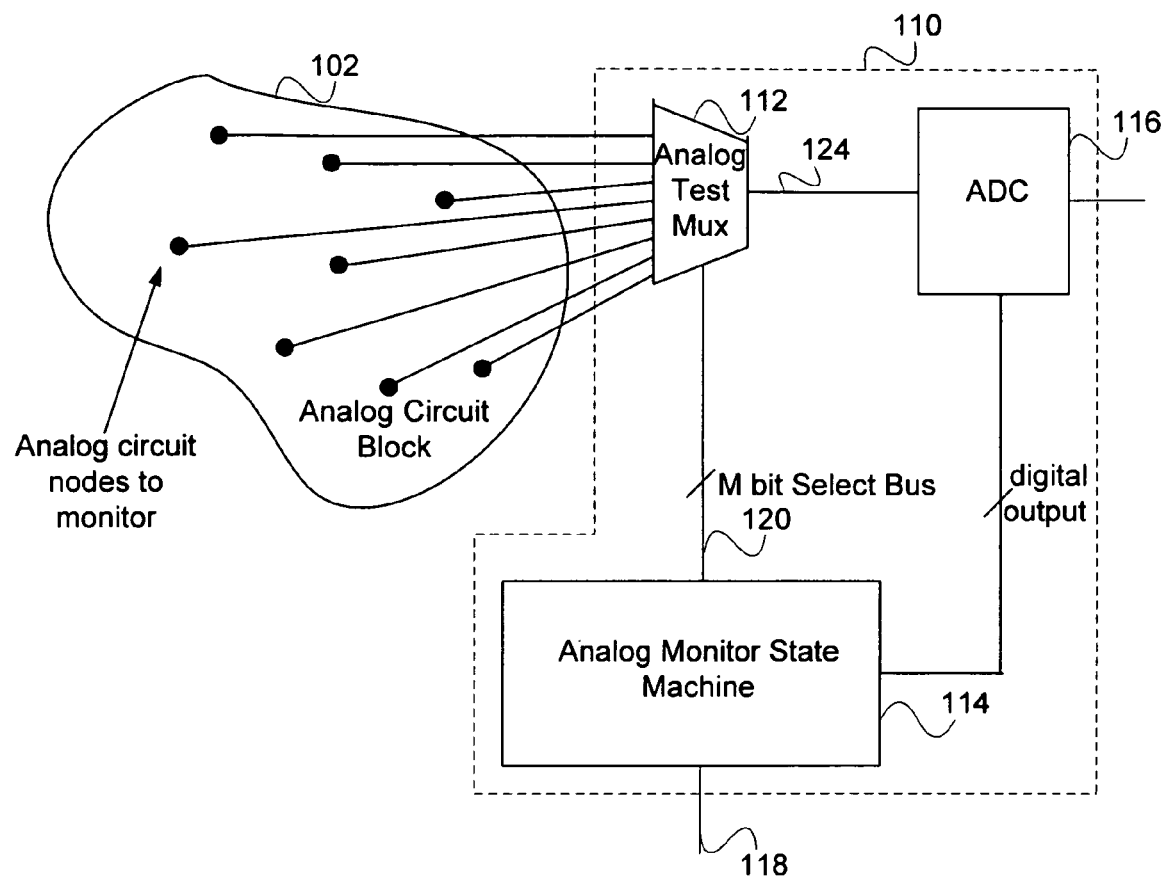
FIG. 2 illustrates an analog test module enabling selective access to analog voltages inside an analog block in accordance with one embodiment of the present invention.

FIG. 2 illustrates an analog test module enabling selective access to analog voltages inside an analog block in accordance with one embodiment of the present invention. The analog test module 110 includes an analog test multiplexer (mux) 112 and an analog monitor state machine 114. The analog test multiplexer 112 multiplexes a plurality of analog voltages from an analog block 102 and enables random access to each of the analog voltages inside the analog block 102. The voltage inputs 122 of an analog test multiplexer 112 are coupled to the plurality of voltages inside the analog block

102. For example, the voltage inputs 122 of the analog test mux 112 may be connected to a loop filter control voltage. In another example, the analog test mux voltage inputs 122 may be coupled to a current source diode. The analog test multiplexer 112 also receives a plurality of selection bits, which dynamically control the analog test mux 112. The output from the analog output 124 from the analog test multiplexer 112 can be processed to check if the analog voltages are within specified tolerances.

The analog monitor state machine 114 contains a digital logic circuit to generate an address associated with an analog voltage inside the analog block 102 and generates the plurality of selection bits from the address. The analog monitor state machine 114 transmits the selection bits to the analog test multiplexer 112 using a selection bus 120, which is M bits wide. The number of bits of the selection bus 120, M, corresponds to the number of selection bits needed to select any of the analog voltages inside the analog block 102. In one embodiment, the analog monitor state machine 114 can be implemented off-chip via a microprocessor. In another embodiment, the analog monitor state machine 114 may have a control input 118 enabling user selection of one of the plurality of analog voltages to be transmitted to the output. In one example, a user may desire to monitor a specific voltage in the analog block 102. By transmitting a signal to the control input 118 of the analog monitor state machine 114, the user can configure the analog monitor state machine 114 to select a specific analog voltage to send to the output 124 and override the default sequence of accessing the analog voltages.

In one embodiment of the analog test module 110, the analog test module 110 further includes an analog to digital converter (ADC) 116 converting the selected analog voltage from the analog test multiplexer 112 into a digital representation. The analog to digital converter 116 converts the analog voltage to a digital signal which can be processed by the system. In one embodiment, the analog to digital converter is located off-chip and the digital output of the analog to digital converter 116 routed back to the integrated circuit and is connected to the core logic of a programmable logic device, such as a field programmable gate array (FPGA). The digital representation from the analog to digital converter 116 is transmitted to the analog monitor state machine 114, which monitors each analog voltage inside the analog block 102 in a default sequence. In another embodiment, the digital representation from the analog to digital converter 116 is transmitted to an input/output ring for analysis outside the integrated circuit.

In another embodiment, the analog test module 110 further includes a lookup table with pre-determined allowed values for each of the plurality of analog voltages inside the analog block. The digital representation of the values of analog voltages inside the analog block is compared to pre-determined allowed values or range stored in the lookup table. A pre-determined allowed value is associated with each analog voltage inside the analog block 102, where each allowed value is indicative of proper operation of the circuits in the analog block 102. For instance, a circuit designer designing an amplifier inside the analog block 102 to properly operate under certain bias conditions can store the bias conditions in the lookup table for real time comparison with the measured bias values from the analog block 102.

In another example, the control voltage of a phase lock loop can be accessed to verify if the phase lock loop control voltage is stable. If the phase lock loop is locking properly, the control voltage should be stable. In addition, internal bias voltages of the phase lock loop can be accessed by the analog test mux 112 and compared with allowed values in the lookup table to verify the internal bias voltages are within the valid prescribed range.

In another embodiment, the lookup table is contained within the analog monitor state machine 114. In yet another embodiment, the lookup table is implemented in the core logic of a FPGA. In other embodiments, the lookup table is implemented off-chip through a microprocessor. The lookup table may contain a plurality of diagnostic error messages, where each of the diagnostic error messages correspond to values of the analog voltages which are outside the stored allowed values. When the comparison of the digital representation to the pre-determined allowed voltage indicates the analog voltage is outside the allowed value, the analog state machine 114 can transmit an error message indicating which voltage is triggering the diagnostic error message. As in the above example, the circuit designer can associate a diagnostic error message with a situation indicating the bias of an amplifier is outside the bias the amplifier was designed to operate.

Figure 3A:
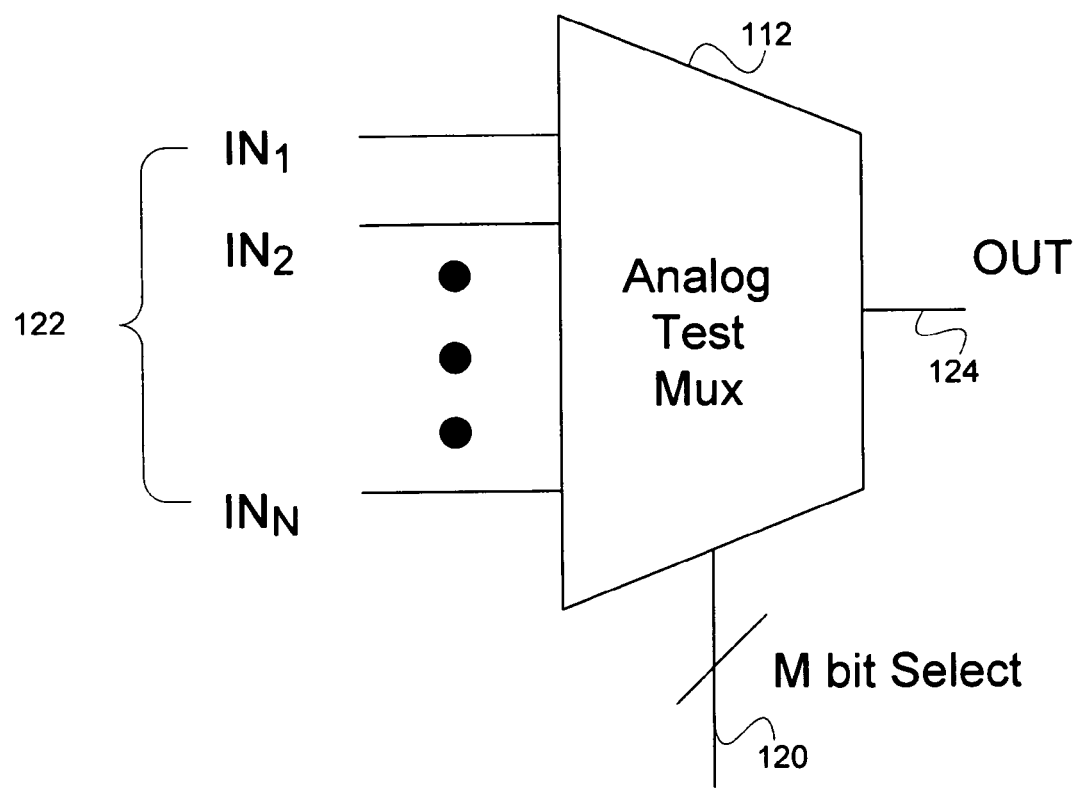
FIG. 3A illustrates an analog test multiplexer enabling selective access to analog voltages in accordance with one embodiment of the present invention.

FIG. 3A illustrates an analog test multiplexer enabling selective access to analog voltages in accordance with one embodiment of the present invention. The analog voltages inside the analog block are coupled to the plurality voltage inputs 122 of the analog test mux 112. The analog test mux 112 further includes a selection bus 120 which allows multiplexing of the plurality of analog voltages to a single output 124. The selection bus 120 receives a selection signal of M bits from the analog monitor state machine. The selection signal is configured to be wide enough to select any of the analog voltages coupled to the analog test mux 112 for transmission to the output 124. Random access to any of the analog voltages inside the analog block is enabled by controlling the selection bits provided to the analog test mux 112. In one embodiment, the dynamically controlled analog test multiplexer 112 is utilized to direct the selected analog voltages to an ADC.

Figure 3B:
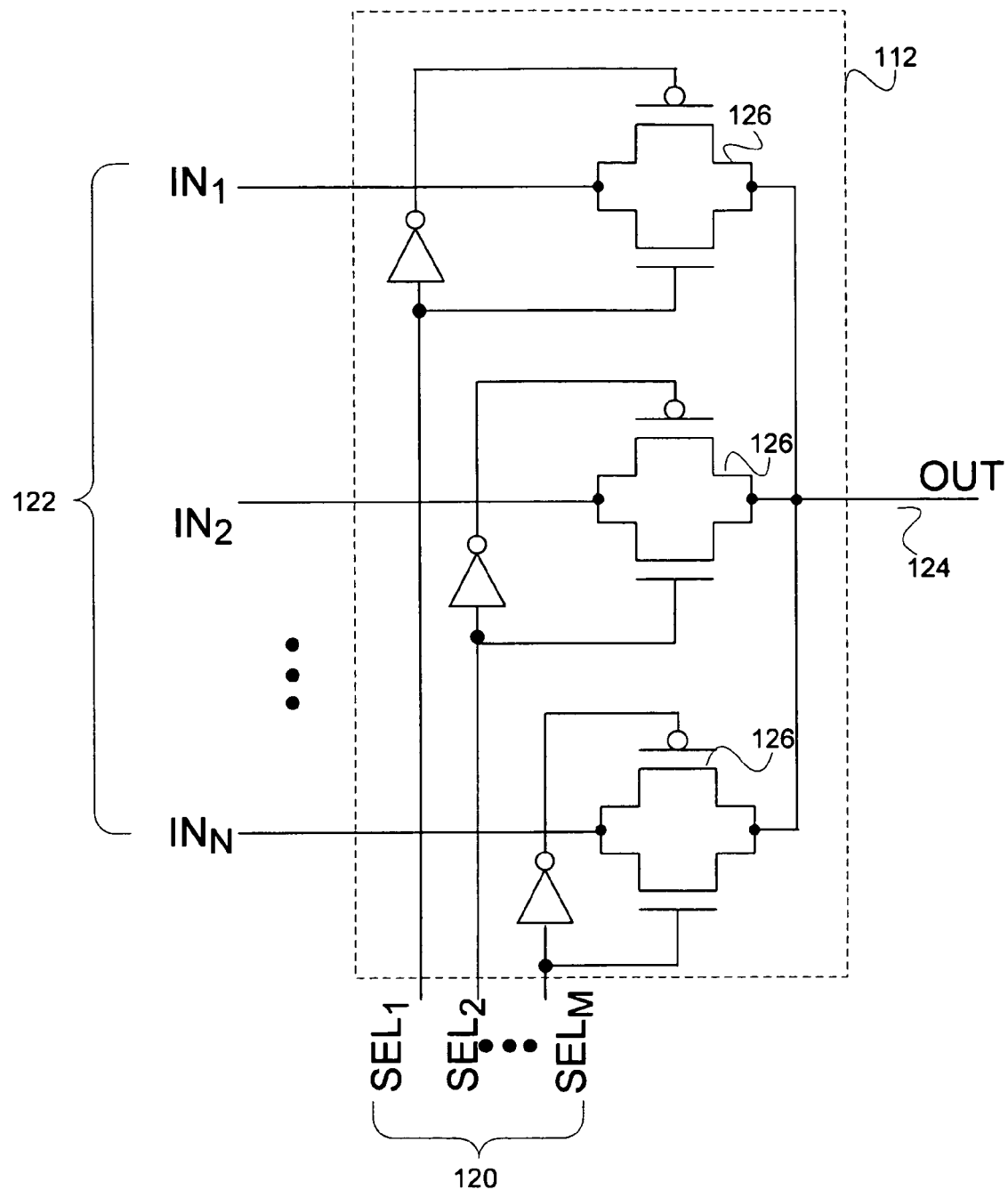
FIG. 3B illustrates an analog test multiplexer implemented using complementary metal-oxide semiconductor pass gates in accordance with one embodiment of the present invention.

FIG. 3B illustrates an analog test multiplexer implemented using complementary metal-oxide semiconductor pass gates in accordance with one embodiment of the present invention. The analog test multiplexer 112 is implemented using a plurality of complementary metal-oxide semiconductor (CMOS) pass gates 126, where the number of CMOS pass gates 126 is equal to the number of bits of the selection bus 120 of the analog monitor state machine. The use of CMOS pass gates 126 enables the analog test multiplexer 112 to transmit analog voltages of any value between the power supply voltage and ground. In one embodiment, when a selection bit 120 is high (digital 1), the CMOS pass gate 126 associated with the particular selection bit 120 is activated. Activation of the CMOS pass gate 126 directs the voltage at the voltage input 122 associated with the CMOS pass gate 126 to the output of the analog test mux 112. For a selection bit 120 that is low (digital 0), the CMOS pass gate 126 associated with the particular selection bit 120 will remain inactive.

Although a specific transistor configuration was used to illustrate one embodiment of the analog test multiplexer 112, one with skill in the art will appreciate other transistor configurations can be used. That is, so long as the essential functions of receiving the plurality of analog voltages and selection bits, and selectively transmitting the selected voltage to the output of the analog test multiplexer are retained, other transistor configurations are possible.

Figure 4:
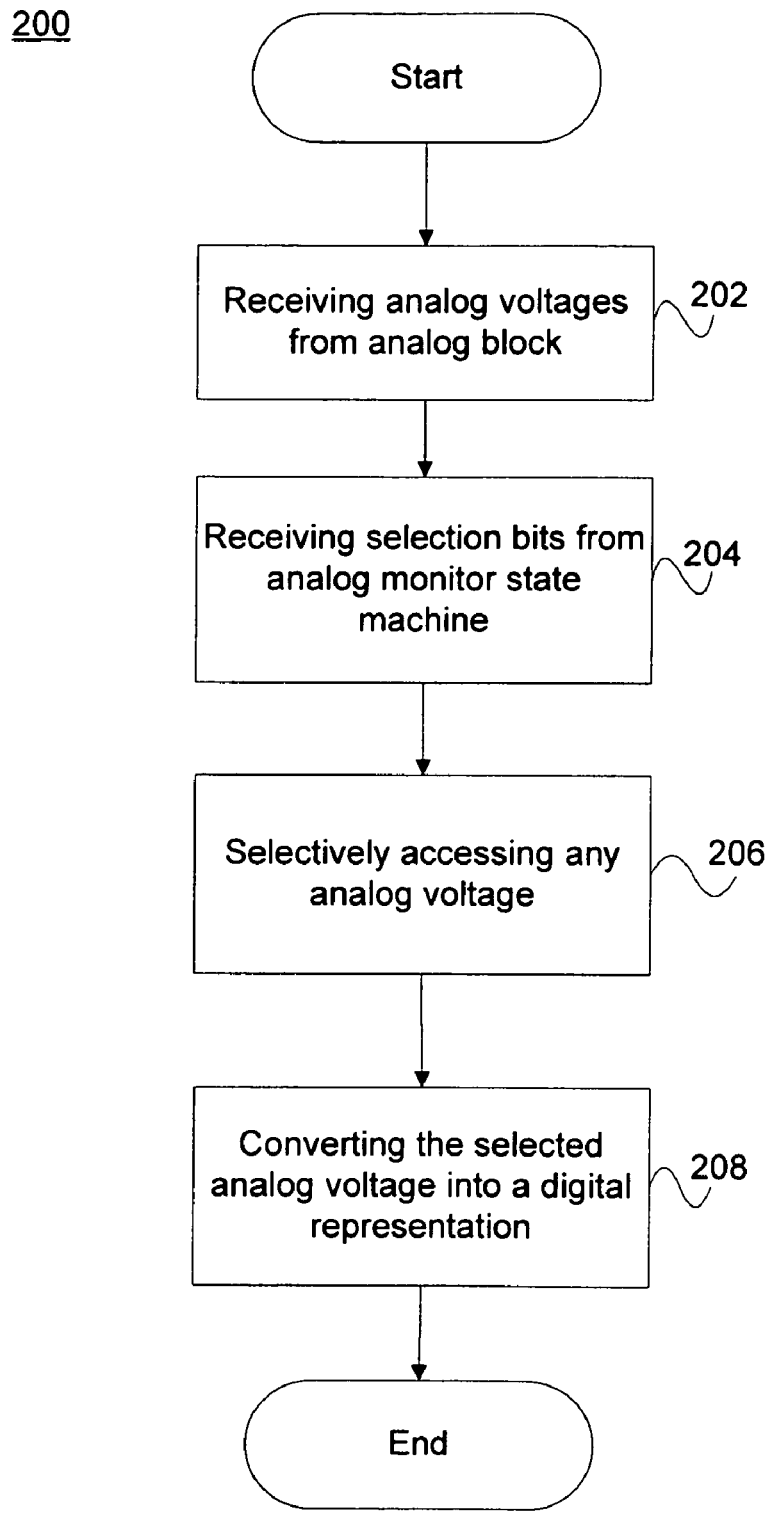
FIG. 4 is a flow chart diagram illustrating method operations for selectively accessing analog voltages inside an analog block in accordance with one embodiment of the present invention.

FIG. 4 is a flow chart diagram illustrating method operations for selectively accessing analog voltages inside an analog block in accordance with one embodiment of the present invention. The method 200 begins with operation 202, where the analog test multiplexer receives the analog voltages from the analog block. As illustrated in FIG. 2, each voltage input of the analog test mux is coupled to a corresponding analog voltage in the analog block. In operation 204, the analog test multiplexer receives the selection bits, i.e. selection signal, from an analog monitor state machine. In one embodiment, the logic of analog monitor state machine which generates the selection bits is implemented in the core logic of a field-programmable gate array. The method 200 advances to operation 206, where through the selection bit input, the analog test mux selectively accesses any of the analog voltages inside the analog block. In one embodiment, the analog state machine selects each of the analog voltages in a default sequence. In another embodiment, the analog monitor state machine can be reconfigured, using the control input, to access the analog voltages in a different sequence than the default sequence.

Operation 208 of the method 200, converts the selectively accessed analog voltage into a digital representation through the use of an analog to digital converter. In one embodiment, the digital representation is transmitted to the analog monitor state machine and compared with a pre-determined value stored in the lookup table of the associated analog voltage, as discussed with reference to FIG. 2. In another embodiment, a diagnostic error message is transmitted if the digital representation of the analog voltage is outside the pre-determined values, where the diagnostic error message is associated with a particular analog voltage from the analog block.

The method and apparatus described herein may be incorporated into any suitable circuit, including processors and programmable logic devices (PLDs). The PLDs can include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by ALTERA CORPORATION.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit comprising:
   an analog test multiplexer operable to multiplex a plurality of analog voltages from an analog block, the analog test multiplexer operable to provide access to each of the plurality of analog voltages;
   an analog monitor state machine operable to generate an address associated with an analog voltage of the analog block, the analog state machine further operable to generate a selection signal based on the address and provide the selection signal to the analog test multiplexer; and
   an analog to digital converter converting an analog voltage from the analog test multiplexer to a digital representation.

2. The integrated circuit of claim 1, wherein the analog monitor state machine includes a lookup table with a plurality of pre-determined allowed values for each of the plurality of analog voltages inside the analog block.

3. The integrated circuit of claim 2, wherein the plurality of pre-determined allowed values are compared to values of the plurality of analog voltages.

4. The integrated circuit of claim 3, wherein the lookup table stores a plurality of diagnostic error messages, and wherein one of the plurality of diagnostic messages is transmitted when a value of the plurality of analog voltages is outside a corresponding one of the pre-determined allowed values.

5. The integrated circuit of claim 2, wherein the analog monitor state machine has a default sequence of accessing the plurality of analog voltages inside the analog block.

6. The integrated circuit of claim 1 further comprising:
   a core logic of a field programmable gate array coupled to an output of the analog to digital converter, wherein the analog state machine and the lookup table are implemented in the core logic of the field programmable gate array.

7. The integrated circuit of claim 1, wherein the digital representation from the analog to digital converter is transmitted to an input/output ring of the integrated circuit.

8. The integrated circuit of claim 1, wherein the integrated circuit is implemented in a programmable logic device.

9. An analog test module comprising:
   an analog test multiplexer operable to receive a plurality of selection bits and a plurality of analog voltage inputs, and operable to output an analog output, each of the plurality of analog voltage inputs coupled to a corresponding analog voltage inside an analog block; and
   an analog monitor state machine having a digital logic circuit, wherein the digital logic circuit is operable to generate an address associated with an analog voltage inside the analog block and operable to generate the plurality of selection bits from the address, the analog monitor state machine is operable to transmit the plurality of selection bits to the analog test multiplexer, the plurality of selection bits is operable to select which of the plurality of analog voltage inputs is transmitted to the analog output and the plurality of selection bits is operable to provide selective access to any of the plurality of analog voltages inside the analog test block, wherein the analog state machine is operable to compare the analog output to a predetermined value and wherein the analog state machine is operable to generate an error message when a value of the analog output is outside the pre-determined value.

10. The analog test module of claim 9, wherein the analog test multiplexer is implemented using a plurality of CMOS pass gates, wherein a number of CMOS pass gates is equal to a number of the plurality of selection bits.

11. The analog test module of claim 9, wherein the plurality of address inputs from the analog monitor state machine provides random access to each of the plurality of analog voltages inside the analog block.

12. The analog test module of claim 9, wherein the analog monitor state machine has a control input selecting one of the plurality of analog voltages to be transmitted to the analog output.

13. The analog test module of claim 9, wherein the analog monitor state machine contains logic to generate the plurality of selection bits.

14. A method of selectively analyzing analog voltages inside an analog block comprising
   receiving a plurality of analog voltages from the analog block;
   generating an address associated with one of the plurality of analog voltages;
   generating a plurality of selection bits from the address;
   receiving the plurality of selection bits from an analog monitor state machine;
   selecting one of the plurality of analog voltages based on the plurality of selection bits;
   converting the selectively accessed analog voltage into a digital representation;
   comparing the digital representation with a pre-determined value of an associated analog voltage; and
   transmitting an error message if the digital representation of the analog voltage is outside the pre-determined value, wherein the diagnostic error message is associated with a particular analog voltage from the analog block.

15. The method of claim 14 further comprising:
accessing the pre-determined value from a look up table.

16. The method of claim 14 further compromising
cycling through a default sequence of the plurality of selection bits to access the plurality of analog voltages.

17. The method of claim 14 further comprising:
overriding a default sequence of accessing the plurality of analog voltage by use of a control input to the analog monitor state machine.

18. The method of claim 14 further comprising:
transmitting the digital representation to a probe point outside an integrated circuit.

19. The method of claim 14 further comprising:
reconfiguring the analog monitor state machine by use of a control input.

* * * * *